(12) United States Patent
Sadaka

(10) Patent No.: US 8,778,773 B2
(45) Date of Patent: *Jul. 15, 2014

(54) METHODS FOR DIRECTLY BONDING TOGETHER SEMICONDUCTOR STRUCTURES, AND BONDED SEMICONDUCTOR STRUCTURES FORMED USING SUCH METHODS

(75) Inventor: Mariam Sadaka, Austin, TX (US)

(73) Assignee: Soitec, Bernin (FR)

( * ) Notice: Subject to any disclaimer, the term of this patent is extended or adjusted under 35 U.S.C. 154(b) by 46 days.

This patent is subject to a terminal disclaimer.

(21) Appl. No.: 12/970,422

(22) Filed: Dec. 16, 2010

(65) Prior Publication Data

US 2012/0153484 A1 Jun. 21, 2012

(51) Int. Cl.
*H01L 21/30* (2006.01)

(52) U.S. Cl.
USPC .................................. 438/455; 257/E21.122

(58) Field of Classification Search
USPC ......... 438/106, 108, 109, 118, 406, 455, 457;
257/676, 762, 772, 782, E23.02,
257/E23.04, E21.088, E21.122, E21.48,
257/E21.567
See application file for complete search history.

(56) References Cited

U.S. PATENT DOCUMENTS

| | | | |
|---|---|---|---|
| 6,960,492 B1 | 11/2005 | Miyamoto | |
| 7,442,992 B2 * | 10/2008 | Tomita et al. | 257/347 |
| 2003/0113947 A1 | 6/2003 | Vandentop et al. | |
| 2004/0262772 A1 * | 12/2004 | Ramanathan et al. | 257/777 |
| 2005/0003664 A1 | 1/2005 | Ramanathan et al. | |
| 2005/0104216 A1 | 5/2005 | Cabral, Jr. et al. | |
| 2006/0234473 A1 | 10/2006 | Wong et al. | |
| 2007/0048898 A1 * | 3/2007 | Carlson et al. | 438/106 |
| 2007/0197023 A1 | 8/2007 | Widodo et al. | |
| 2008/0006451 A1 | 1/2008 | Leahy et al. | |
| 2008/0116584 A1 | 5/2008 | Sitaram | |
| 2008/0213997 A1 | 9/2008 | Lee et al. | |
| 2009/0134521 A1 | 5/2009 | Liu et al. | |
| 2010/0044869 A1 | 2/2010 | Zhang et al. | |
| 2010/0308463 A1 | 12/2010 | Yu et al. | |

FOREIGN PATENT DOCUMENTS

| | | |
|---|---|---|
| CN | 1466187 A | 1/2004 |
| CN | 101515563 A | 8/2009 |
| FR | 2872625 A1 | 1/2006 |
| JP | 2000299379 A | 10/2000 |
| JP | 2003179000 A | 6/2003 |
| JP | 2004235454 A | 8/2004 |
| JP | 2008046115 A | 2/2008 |
| JP | 2009164471 A | 7/2009 |

OTHER PUBLICATIONS

Chattopadhyay et al., In-situ Formation of a Copper Silicide Cap for TDDB and Electromigration Improvement, 44th Annual International Reliability Physics Symposium, San Jose, 2006, 128-130.

(Continued)

*Primary Examiner* — Brook Kebede
(74) *Attorney, Agent, or Firm* — TraskBritt

(57) ABSTRACT

Embodiments of the present invention include methods of directly bonding together semiconductor structures. In some embodiments, a cap layer may be provided at an interface between directly bonded metal features of the semiconductor structures. In some embodiments, impurities are provided within the directly bonded metal features of the semiconductor structures. Bonded semiconductor structures are formed using such methods.

42 Claims, 9 Drawing Sheets

(56) References Cited

OTHER PUBLICATIONS

Chen et al., Microstructure Evolution and Abnormal Grain Growth During Copper Wafer Bonding, Applied Physics Letters, vol. 81, No. 20, Nov. 11, 202, pp. 3774-3776.

Gambino et al., Copper Interconnect Technology for the 32 nm Node and Beyond, IEEE 2009 Custom Intergrated Circuits Conference (CICC), 2009, pp. 141-148.

Gambino et al., Yield and Reliability of Cu Capped with CoWP Using a Self-Activated Process, Microelectronic Engineering, vol. 83, Issues 11-12, Nov.-Dec. 2006, pp. 2059-2067.

Gan et al., Effect of Passivation on Stress Relaxation in Electroplated Copper Films, J. Mater. Res., vol. 21, No. 6, Jun. 2006, pp. 1512-1518.

Lambert et al., Study of CMOS-Compatible Copper Etching for Organic Coating, vol. 25, Issue 5—Oct. 4-Oct. 9, 2009, 1 page.

Lu et al., Failure by Simultaneous Grain Growth, Strain Localization, and Interface Debonding in Metal Films on Polymer Substrates, J. Mater. Res., vol. 24, No. 2, Feb. 2009, pp. 379-385.

Tan et al., Progress in Copper-Based Wafer Bonding, Electronic Materials and Packaging, EMAP 2008 International Conference, Oct. 22-24, 2008, pp. 45-48.

Yokogawa et al., Tradeoff Characteristics Between Resistivity and Reliability for Scaled-Down Cu-Based Interconnects, IEEE Transactions on Electron Devices, vol. 55, No. 1, Jan. 2008, pp. 350-357.

Preliminary Search Report and Opinion for French Application No. 1061166 dated Jul. 27, 2011, 14 pages.

Partial European Search Report for European Application No. 11193906.2 completed Jan. 26, 2012, 6 pages.

Chhun et al., Influence of SiH4 Process Step on Physical and Electrical Properties of Advanced Copper Interconnects, Microelectronic Engineering, vol. 76, pp. 106-112 (2004).

Yokogawa et al., Analysis of Al Doping Effects on Resistivity and Electromigration of Copper Interconnects, IEEE Transactions on Device and Materials Reliability, vol. 8, No. 1, pp. 216-221 (Mar. 2008).

Singapore Search Report and Written Opinion conducted by the Hungarian Intellectual Property Office for Singapore Application No. 201107666-8 dated Jun. 8, 2012, 13 pages.

Gosset et al., Integration and characterization of a self-aligned barrier to Cu diffusion based on copper silicide, 2003 Advanced Metallization Conference Proceedings, USA, Materials Research Society, Oct. 21, 2003, p. 321-328.

Kim et al., Room Temperature Cu-Cu Direct Bonding Using Surface Activated Bonding Method, J. Vac. Sci. Technol. A, vol. 21, No. 2, Mar./Apr. 2003, pp. 449-453.

KIPO Notice of Preliminary Rejection for Korean Application No. 10-2011-0129058 dated Apr. 29, 2013, 7 pages.

Japanese Office Action for Japanese Application No. 2011-260461 dated Aug. 20, 2013, 3 pages.

Chinese Office Action and Search Report for Chinese Application No. 201110421060.7 dated Jan. 2, 2014, 5 pages.

\* cited by examiner

METHODS FOR DIRECTLY BONDING TOGETHER SEMICONDUCTOR STRUCTURES, AND BONDED SEMICONDUCTOR STRUCTURES FORMED USING SUCH METHODS

TECHNICAL FIELD

The present invention relates to methods of directly bonding together semiconductor structures, and to bonded semiconductor structures formed using such methods.

BACKGROUND

The three-dimensional (3D) integration of two or more semiconductor structures can produce a number of benefits to microelectronic applications. For example, 3D integration of microelectronic components can result in improved electrical performance and power consumption while reducing the area of the device footprint. See, for example, P. Garrou et al., "The Handbook of 3D Integration," Wiley-VCH (2008).

The 3D integration of semiconductor structures may take place by the attachment of a semiconductor die to one or more additional semiconductor dice (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

The bonding techniques used in bonding one semiconductor structure to another semiconductor structure may be categorized in different ways, one being whether a layer of intermediate material is provided between the two semiconductor structures to bond them together, and the second being whether the bonding interface allows electrons (i.e., electrical current) to pass through the interface. So called "direct bonding methods" are methods in which a direct solid-to-solid chemical bond is established between two semiconductor structures to bond them together without using an intermediate bonding material between the two semiconductor structures to bond them together. Direct metal-to-metal bonding methods have been developed for bonding metal material at a surface of a first semiconductor structure to metal material at a surface of a second semiconductor structure.

Direct metal-to-metal bonding methods may also be categorized by the temperature range in which each is carried out. For example, some direct metal-to-metal bonding methods are carried out at relatively high temperatures resulting in at least partial melting of the metal material at the bonding interface. Such direct bonding processes may be undesirable for use in bonding processed semiconductor structures that include one or more device structures, as the relatively high temperatures may adversely affect the earlier formed device structures.

"Thermo-compression bonding" methods are direct bonding methods in which pressure is applied between the bonding surfaces at elevated temperatures between two hundred degrees Celsius (200° C.) and about five hundred degrees Celsius (500° C.), and often between about three hundred degrees Celsius (300° C.) and about four hundred degrees Celsius (400° C.).

Additional direct bonding methods have been developed that may be carried out at temperatures of two hundred degrees Celsius (200° C.) or less. Such direct bonding processes carried out at temperatures of two hundred degrees Celsius (200° C.) or less are referred to herein as "ultra-low temperature" direct bonding methods. Ultra-low temperature direct bonding methods may be carried out by careful removal of surface impurities and surface compounds (e.g., native oxides), and by increasing the area of intimate contact between the two surfaces at the atomic scale. The area of intimate contact between the two surfaces is generally accomplished by polishing the bonding surfaces to reduce the surface roughness up to values close to the atomic scale, by applying pressure between the bonding surfaces resulting in plastic deformation, or by both polishing the bonding surfaces and applying pressure to attain such plastic deformation.

Some ultra-low temperature direct bonding methods may be carried out without applying pressure between the bonding surfaces at the bonding interface, although pressure may be applied between the bonding surfaces at the bonding interface in other ultra-low temperature direct bonding methods in order to achieve a suitable bond strength at the bonding interface. Ultra-low temperature direct bonding methods in which pressure is applied between the bonding surfaces are often referred to in the art as "surface assisted bonding" or "SAB" methods. Thus, as used herein, the terms "surface assisted bonding" and "SAB" mean and include any direct bonding process in which a first material is directly bonded to a second material by abutting the first material against the second material and applying pressure between the bonding surfaces at the bonding interface at a temperature of two hundred degrees Celsius (200° C.) or less.

Direct metal-to-metal bonds between active conductive features in semiconductor structures may, in some instances, be prone to mechanical failure or electrical failure after a period of time even though an acceptable direct metal-to-metal bond may be initially established between the conductive features of the semiconductor structures. Although not fully understood, it is believed that such failure may be at least partially caused by one or more of three related mechanisms. The three related mechanisms are strain localization, which may be promoted by large grains, deformation-associated grain growth, and mass transport at the bonding interface. Such mass transport at the bonding interface may be at least partially due to electromigration, phase segregation, etc.

Electromigration is the migration of metal atoms in a conductive material due to an electrical current. Various methods for improving the electromigration lifetime of interconnects have been discussed in the art. For example, methods for improving the electromagnetic lifetime of copper interconnects are discussed in J. Gambino et al., "Copper Interconnect Technology for the 32 nm Node and Beyond," IEEE 2009 Custom Integrated Circuits Conference (CICC), pages 141-148.

BRIEF SUMMARY

This summary is provided to introduce a selection of concepts in a simplified form that, which concepts are further described in the detailed description below of some example embodiments of the invention. This summary is not intended to identify key features or essential features of the claimed subject matter, nor is it intended to be used to limit the scope of the claimed subject matter.

In some embodiments, the present invention includes methods of directly bonding a first semiconductor structure to a second semiconductor structure. A cap layer may be formed that comprises a metal and silicon at a surface of a first metal feature on the first semiconductor structure. A surface of the cap layer may define a first bonding surface of the first metal feature. A second bonding surface of a second metal feature on the second semiconductor structure may be directly bonded to the first bonding surface of the first metal feature on the first semiconductor structure.

In additional embodiments, the present invention includes further methods of directly bonding a first semiconductor structure to a second semiconductor structure. A metal cap layer may be formed at a surface of a first metal feature on the first semiconductor structure. A surface of the metal cap layer defines a first bonding surface of the first metal feature. A second bonding surface of a second metal feature on the second semiconductor structure may be directly bonded to the first bonding surface of the first metal feature on the first semiconductor structure.

In yet further embodiments of methods of the invention, a first semiconductor structure may be directly bonded to a second semiconductor structure using methods in which a first metal feature on the first semiconductor structure is doped with impurities, and a second metal feature on the second semiconductor structure is directly bonded to the first metal feature on the first semiconductor structure.

In additional embodiments, the present invention includes bonded semiconductor structures that may be formed using methods as described herein. For example, a bonded semiconductor structure may include a first semiconductor structure comprising a first metal feature, and a second semiconductor structure comprising a second metal feature. The second metal feature of the second semiconductor structure may be directly bonded to the first metal feature of the first semiconductor structure. Impurities may be present at a bonding interface between the first metal feature and the second metal feature.

In further embodiments, bonded semiconductor structures may include a first semiconductor structure comprising a first metal feature having a first major surface, and a second semiconductor structure comprising a second metal feature at least partially surrounded by a dielectric material. The second metal feature of the second semiconductor structure may have a second major surface directly bonded to a portion of the first major surface of the first metal feature of the first semiconductor structure. A cap material may be disposed directly between a surface of the dielectric material and another portion of the first major surface of the first metal feature of the first semiconductor structure.

BRIEF DESCRIPTION OF THE DRAWINGS

The present invention may be understood more fully by reference to the following detailed description of example embodiments of the present invention, which are illustrated in the appended figures in which.

DETAILED DESCRIPTION

Figure 1A:
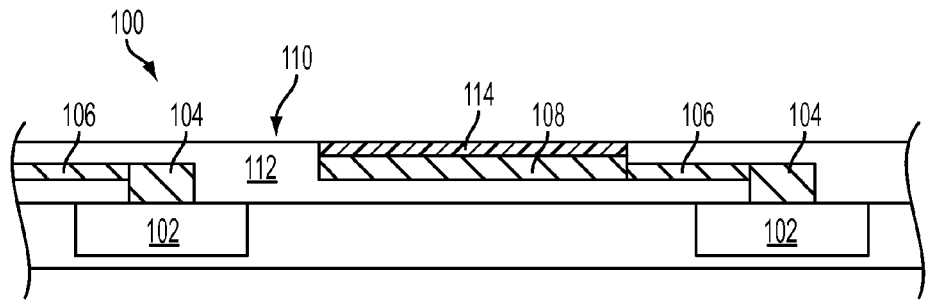
FIGS. 1A-1G are simplified cross-sectional views illustrating example embodiments of methods of forming bonded semiconductor structures of the invention.

The illustrations presented herein are not meant to be actual views of any particular material, device, system, or method, but are merely idealized representations that are used to describe embodiments of the invention.

Any headings used herein should not be considered to limit the scope of embodiments of the invention as defined by the claims below and their legal equivalents. Concepts described in any specific heading are generally applicable in other sections throughout the entire specification.

A number of references are cited herein, the entire disclosures of which are incorporated herein in their entirety by this reference for all purposes. Further, none of the cited references, regardless of how characterized herein, is admitted as prior art relative to the invention of the subject matter claimed herein.

As used herein, the term "semiconductor structure" means and includes any structure that is used in the formation of a semiconductor device. Semiconductor structures include, for example, dies and wafers (e.g., carrier substrates and device substrates), as well as assemblies or composite structures that include two or more dies and/or wafers three-dimensionally integrated with one another. Semiconductor structures also include fully fabricated semiconductor devices, as well as intermediate structures formed during fabrication of semiconductor devices.

As used herein, the term "processed semiconductor structure" means and includes any semiconductor structure that includes one or more at least partially formed device structures. Processed semiconductor structures are a subset of semiconductor structures, and all processed semiconductor structures are semiconductor structures.

As used herein, the term "bonded semiconductor structure" means and includes any structure that includes two or more semiconductor structures that are attached together. Bonded semiconductor structures are a subset of semiconductor structures, and all bonded semiconductor structures are semiconductor structures. Furthermore, bonded semiconductor structures that include one or more processed semiconductor structures are also processed semiconductor structures.

As used herein, the term "device structure" means and includes any portion of a processed semiconductor structure that is, includes, or defines at least a portion of an active or passive component of a semiconductor device to be formed on or in the semiconductor structure. For example, device structures include active and passive components of integrated circuits such as transistors, transducers, capacitors, resistors, conductive lines, conductive vias, and conductive contact pads.

As used herein, the term "through wafer interconnect" or "TWI" means and includes any conductive via extending through at least a portion of a first semiconductor structure that is used to provide a structural and/or an electrical interconnection between the first semiconductor structure and a second semiconductor structure across an interface between the first semiconductor structure and the second semiconductor structure. Through wafer interconnects are also referred to in the art by other terms, such as "through silicon vias," "through substrate vias," "through wafer vias," or abbreviations of such terms, such as "TSVs" or "TWVs." TWIs typically extend through a semiconductor structure in a direction generally perpendicular to the generally flat, major surfaces of the semiconductor structure (i.e., in a direction parallel to the "Z" axis).

As used herein, the term "active surface," when used in relation to a processed semiconductor structure, means and includes an exposed major surface of the processed semiconductor structure that has been, or will be, processed to form one or more device structures in and/or on the exposed major surface of the processed semiconductor structure.

As used herein, the term "back surface," when used in relation to a processed semiconductor structure, means and includes an exposed major surface of the processed semiconductor structure on an opposing side of the processed semiconductor structure from an active surface of the semiconductor structure.

In some embodiments, the present invention comprises improved methods of directly bonding a first semiconductor structure to a second semiconductor structure to form a bonded semiconductor structure. In particular, embodiments of the invention may comprise methods of forming direct metal-to-metal bonds between metal features of a first semiconductor structure and metal features of a second semiconductor structure, such that the electromigration lifetime of the bonded metal features is lengthened relative to previously known methods.

In some embodiments, the direct metal-to-metal bonding methods of the invention may comprise non-thermo compression bonding methods.

A first set of example embodiments of the invention is described below with reference to FIGS. 1A through 1G. Referring to FIG. 1A, a first semiconductor structure 100 may be formed. The first semiconductor structure 100 may comprise one or more active device features, such as, for example, one or more of a plurality of transistors 102 (which are schematically represented in the figures), a plurality of vertically extending conductive vias 104, a plurality of horizontally extending conductive traces 106, and a plurality of bond pads 108. One or more conductive vias 104, conductive traces 106, and/or bond pads 108 may be exposed at an active surface 110 of the first semiconductor structure 100. The active device features may comprise electrically conductive materials and/or semiconductor materials that are surrounded by non-conductive dielectric material 112. By way of example and not limitation, one or more of the conductive vias 104, conductive traces 106, and bond pads 108 may comprise a conductive metal or metal alloy such as, for example, copper, aluminum, or an alloy or mixture thereof.

In accordance with some embodiments of the invention, a cap layer comprising a metal and silicon (e.g., a metal silicide) may be formed at a surface of at least one metal feature of the first semiconductor structure 100 prior to directly bonding that metal feature to at least one metal feature of a second semiconductor structure, as described in further detail below.

As a non-limiting example, one or more bond pads 108 may be exposed at the active surface 110 of the first semiconductor structure 100. Upon formation of the bond pads 108, an oxide material 114 may be disposed at (e.g., on or in) the exposed major surface of the bond pads 108. By way of example and not limitation, the bond pads 108 may comprise copper or a copper alloy, and the oxide material 114 may comprise copper oxide (e.g., CIO). The oxide material 114 may result from intended or unintended oxidation of exposed surfaces of the bond pads 108, and may result from one or more previously performed processes, such as a chemical-mechanical polishing (CMP) method performed during fabrication of the bond pads 108. The oxide material 114 may also simply result from exposure of the bond pads 108 to a gas comprising oxygen (e.g., air).

Figure 1B:
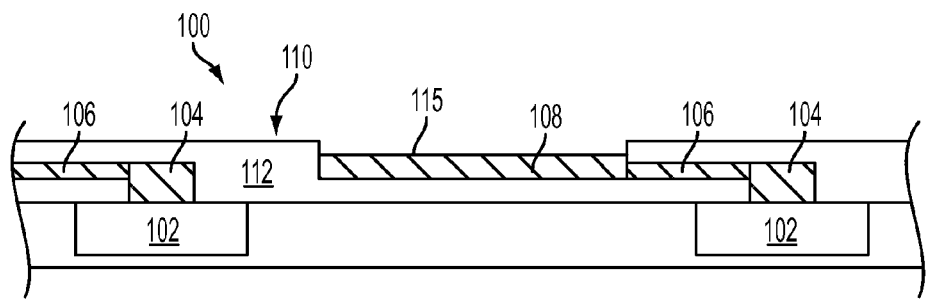

Referring to FIG. 1B, the oxide material 114 may be removed from the bond pads 108. By way of example and not limitation, a wet chemical etching process or a dry plasma etching process may be used to remove the oxide material 114 from the bond pads 108. For example, dry argon plasma etching processes may be used to etch the oxide material 114. As additional examples, inorganic acids such as hydrochloric acid and/or nitric acid, as well as organic acids such as citric acid and/or acetic acid, may be used in wet chemical etching processes to remove the oxide material 114.

Figure 1C:
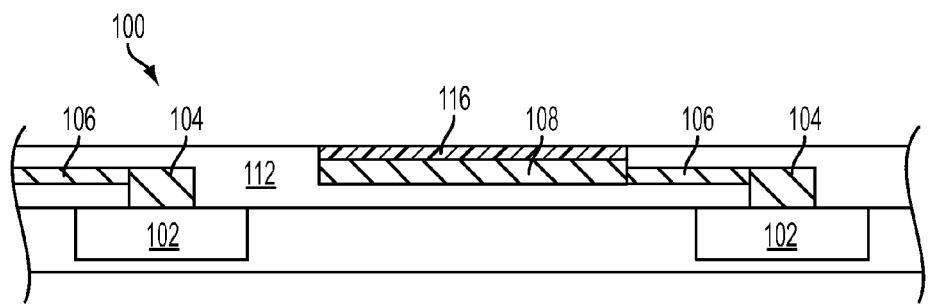
Figure 1D:
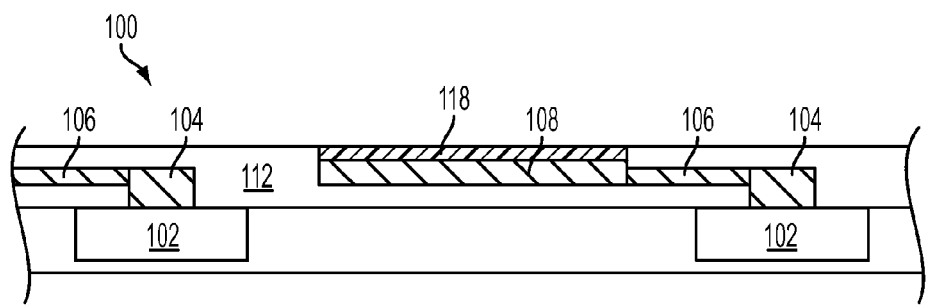

After removing any oxide material 114 that may be present at the surface of the bond pads 108, a cap layer 116 comprising silicon may be formed at (e.g., on or in) the exposed major surface of the bond pads 108, as shown in FIG. 1C. As a non-limiting example, in embodiments in which the bond pads 108 comprise copper or a copper alloy, the cap layer 116 comprising silicon may comprise copper silicide (e.g., $CuSi_x$). Copper silicide may be formed at the surface of bond pads 108 comprising copper or a copper alloy by, for example, exposing the exposed surfaces 115 (FIG. 1B) of the bond pads 108 to a gas comprising $SiH_4$.

By way of example and not limitation, the cap layer 116 may comprise what is referred to in the art as a self-aligned barrier (SAB) formed using a plasma-enhanced chemical vapor deposition (PECVD) (which SABs are often referred to in the art as PSABs) as disclosed in, for example, Chattopadhyay et al., In Situ Formation of a Copper Silicide Cap for TDDB and Electromigration Improvement, IEEE 06CH37728, 44$^{th}$ Annual International Reliability Physics Symposium, San Jose, 2006; L. G. Gosset et al., Advanced Metallization Conference, 2003; and S. Chhun et al., Microelectronic Engineering 76, 2004, pp. 106, each of which is incorporated herein in its entirety by this reference. The PSAB process has high selectivity, low cost of implementation, and benefits to interconnect reliability. The high selectivity of the PSAB process may arise through the natural differences in reactivity and reaction products of the gaseous constituents in the CVD process with the copper and dielectric surfaces. In the case of Si-based PSAB, $SiH_4$ exhibits a thermally activated reaction with copper, but the reaction on the dielectric surface results in the formation of an insulating film on the dielectric material 112. In other words, the PSAB process, in addition to forming a copper silicide cap layer 116 on the bond pads 108, may form a layer of SiC (not shown) on the exposed major surface of the dielectric material 112. The presence of copper silicide on the surface of the copper bond pads 108 protects the copper from oxidizing.

In some embodiments, the cap layer 116 may be formed to have an initial average thickness of about forty nanometers (40 nm) or less, about twenty nanometers (20 nm) or less, or even about ten nanometers (10 nm) or less (i.e., prior to bonding and/or other subsequent processing).

In some embodiments, the cap layer 116 comprising silicon may be further processed to modify a composition of the cap layer 116. By way of example and not limitation, the cap layer 116 comprising silicon may be exposed to a gas or plasma comprising nitrogen ($NH_3$) to form a cap layer 118 (FIG. 1D) that includes both silicon and nitrogen atoms. As a non-limiting example, in embodiments in which the cap layer 116 comprises copper silicide (e.g., $CuSi_x$), the copper silicide may be exposed to $NH_3$ plasma to form copper silicon nitride (CuSiN). By way of example and not limitation, a cap layer 116 of copper silicon nitride may be formed as disclosed in U.S. Patent Application Publication No. 2008/0213997 A1, which published Sep. 4, 2008 in the name of Lee et al., now U.S. Pat. No. 7,718,548, issued May 18, 2010, the entire disclosure of which is incorporated herein in its entirety by this reference. For example, the bond pads 108 may be exposed to a first plasma made from helium, after which the bond pads 108 may be exposed to a second plasma made from a reducing gas to remove copper oxide from the copper surface. The bond pads 108 then may be exposed to silane, which reacts with the copper surface of the bond pads 108 to selectively form copper silicide. After forming the copper silicide on the surfaces of the bond pads 108, the bond pads 108 may be exposed to a third plasma made from ammonia and molecular nitrogen to form the copper silicon nitride on the surfaces of the bond pads 108.

Figure 1E:
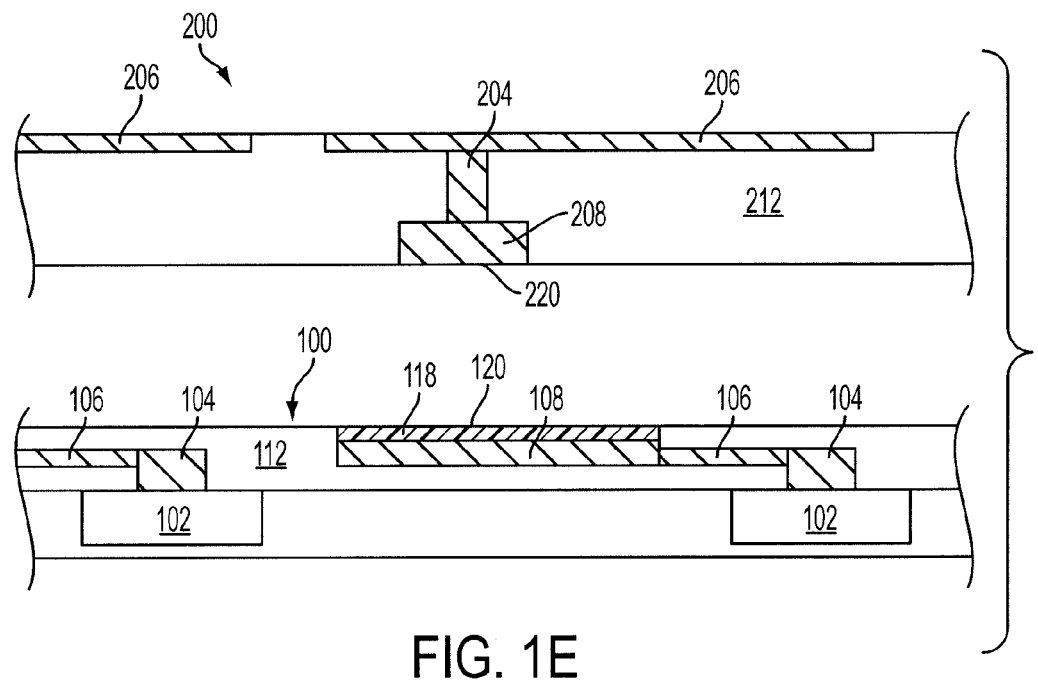

After forming the cap layer 118 that includes a metal, silicon, and nitrogen atoms (e.g., CuSiN), the bond pads 108 may be directly bonded to metal features of a second semiconductor structure. Referring to FIG. 1E, the first semiconductor structure 100 may be aligned with a second semiconductor structure 200 such that the bond pads 108 of the first semiconductor structure 100 are aligned with the conductive metallic bond pads 208 of the second semiconductor structure 200. As shown in FIG. 1E, the second semiconductor structure 200 may include additional active device structures, such as, for example, vertically extending conductive vias 204, laterally extending conductive traces 206. Although not shown in the figures, the second semiconductor structure 200 also may comprise transistors.

Surfaces of the cap layers 118 on the bond pads 108 may define one or more bonding surfaces 120 of the bond pads 108, and exterior exposed surfaces of the bond pads 208 may define bonding surfaces 220 of the bond pads 208 second semiconductor structure 200.

Figure 1F:
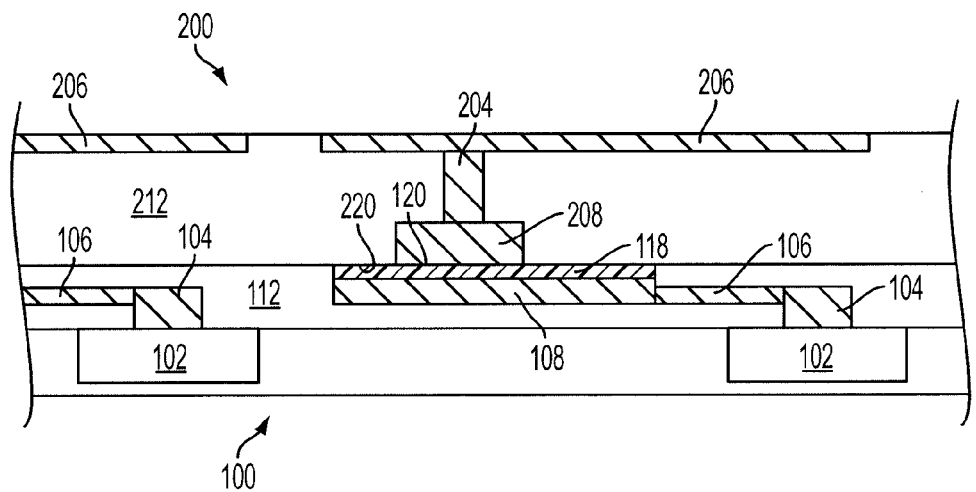

Referring to FIG. 1F, after aligning first semiconductor structure 100 with second semiconductor structure 200 such that the bond pads 108 of the first semiconductor structure 100 are aligned with the conductive metallic bond pads 208 of the second semiconductor structure 200, the first semiconductor structure 100 may be abutted against the second semiconductor structure 200 such that the bonding surfaces 120 of the bond pads 108 of the first semiconductor structure 100 are abutted directly against the bonding surfaces 220 of the bond pads 208 of the second semiconductor structure 200.

Figure 1G:
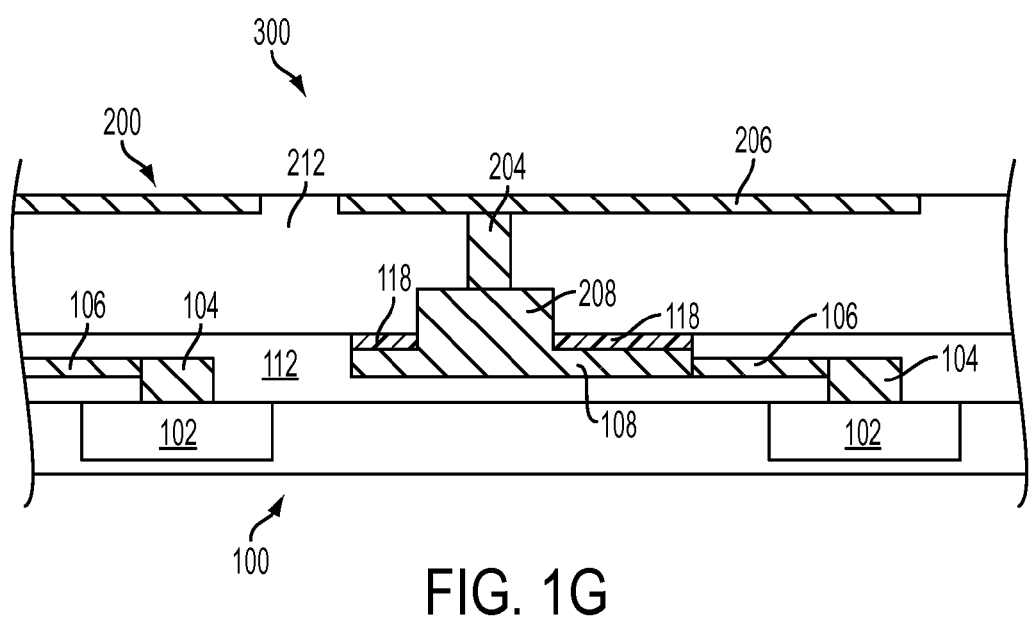

Referring to FIG. 1G, the bonding surfaces 120 (FIGS. 1E and 1F) of the bond pads 108 of the first semiconductor structure 100 then may be directly bonded to the bonding surfaces 220 of the bond pads 208 of the second semiconductor structure 200 to form a bonded semiconductor structure 300. For example, the bonding surfaces 220 (FIGS. 1E and 1F) of the bond pads 208 of the second semiconductor structure 200 may be directly bonded to the bonding surfaces 120 of the bond pads 108 of the first semiconductor structure 100 in a direct metal-to-metal (e.g., copper-to-copper) non-thermo compression bonding process, which, in some embodiments, may be carried out at temperatures of four hundred degrees Celsius (400° C.) or less. In additional embodiments, the non-thermo compression bonding process may comprise an ultra-low temperature direct bonding process carried out at temperatures of two hundred degrees Celsius (200° C.) or less.

As shown in FIG. 1G, in some embodiments, upon directly bonding the bond pads 108 of the first semiconductor structure 100 to the bond pads 208 of the second semiconductor structure 200, one or more elements of the cap layer 118 at an interface between the bond pads 108 and the bond pads 208 may diffuse into the bond pads 108 and/or the bond pads 208, such that the cap layer 118 is no longer present as a distinct phase at the bonded interface between the bond pads 108 and the bond pads 208. At least a portion of the cap layer 118 may remain over at least a portion of the bond pads 108, as shown in FIG. 1G. The presence of at least a portion of the cap layer 118 over the bond pads 108 subsequent to the bonding process may be beneficial for reasons discussed in further detail below.

Prior to bonding the first semiconductor structure 100 to the second semiconductor structure 200, the first semiconductor structure 100 and the second semiconductor structure 200 may be processed to remove surface impurities and undesirable surface compounds, and may be planarized to increase the area of intimate contact at the atomic scale between the bonding surfaces 120 of the bond pads 108 and the bonding surfaces 220 of the bond pads 208. The area of intimate contact between the bonding surfaces 120 and the bonding surfaces 220 may be accomplished by polishing the bonding surfaces 120 and the bonding surfaces 220 to reduce the surface roughness thereof up to values close to the atomic scale, by applying pressure between the bonding surfaces 120 and the bonding surfaces 220 resulting in plastic deformation, or by both polishing the bonding surfaces 120, 220 and applying pressure between the first semiconductor structure 100 and the second semiconductor structure 200 to attain such plastic deformation.

In some embodiments, the first semiconductor structure 100 may be directly bonded to the second semiconductor structure 200 without applying pressure between the bonding surfaces 120, 220 at the bonding interface therebetween, although pressure may be applied between the bonding surfaces 120, 220 at the bonding interface in some ultra-low temperature direct bonding methods in order to achieve a suitable bond strength at the bonding interface. In other words, the direct bonding methods used to bond the bond pads 108 of the first semiconductor structure 100 to the bond pads 208 of the second semiconductor structure 200 may comprise surface assisted bonding (SAB) bonding methods in some embodiments of the invention.

In some embodiments, the bond pads 108 and the bond pads 208 may differ in at least one of size and shape. More particularly, the bond pads 108 may have a first cross-sectional area in a plane parallel to the bonded interface between the bond pads 108 and the bond pads 208, and the bond pads 208 may have a second cross-sectional area in a plane parallel to the bonded interface between the bond pads 108 and the bond pads 208 that differs from the first cross-sectional area of the bond pads 108. The bond pads 108 may have a first cross-sectional shape in a plane parallel to the bonded interface between the bond pads 108 and the bond pads 208, and the bond pads 208 may have a second cross-sectional shape in a plane parallel to the bonded interface between the bond pads 108 and the bond pads 208 that differs from the first cross-sectional shape of the bond pads 108. In embodiments in which the bond pads 108 and the bond pads 208 differ in shape, they may have the same or different sizes.

In additional embodiments, the bond pads 108 and the bond pads 208 may have at least substantially the same cross-sectional size and shape at the bonding interface therebetween. In such embodiments, however, the bond pads 108 and the bond pads 208 may be intentionally or unintentionally misaligned with one another.

In such embodiments wherein the bond pads 108 and the bond pads 208 differ in at least one of size and shape and/or are misaligned with one another, at least a portion of the cap layer 118 on one or more of the bond pads 108 may not abut against, and may not be directly bonded to, any portion of a bond pad 208. Such portions of the cap layer 118 may abut against a dielectric material 212 (FIGS. 1E-1G) surrounding the bond pads 208, for example. These portions of the cap layer 118 may or may not be bonded to the abutting dielectric material 212, and may not entirely dissolve into the bond pads 108 upon bonding the bond pads 108 to the bond pads 208. In such embodiments, the presence of at least a portion of the cap layer 118 at an interface between the bond pads 108 and the dielectric material 212 after the bonding process may improve the useable lifetime and/or improve the performance of, conductive structures formed by the adjoined bond pads 108 and the bond pads 208. For example, the presence of the cap layer 118 at the interface between the bond pads 108 and the dielectric material 212 may hinder or prevent mass transport at the interface between the bond pads 108 and the dielectric material 212, which may occur due to, for example, electromigration. The presence of the cap layer 118 also may suppress the occurrence of undesirable thermomechanical phenomena, such as, for example, undesirable changes in microstructure that might result from temperature fluctuations to which the structures may be subjected during subsequent processing and/or operation.

In additional embodiments, exposed surfaces of one or more active features of the second semiconductor structure 200, such as the exposed surfaces of the bond pads 208, may be processed as discussed above in relation to the bond pads 108 of the first semiconductor structure 100, such that the bonding surfaces 220 of the bond pads 108 comprise a cap layer (like the cap layer 116 and/or the cap layer 118), which may comprise a compound or mixture (e.g., a solid solution) that includes one or both of silicon and nitrogen (e.g., $CuSi_x$ or CuSiN).

In the embodiments described above in relation to FIGS. 1A-1G, the cap layers 116, 118 are not metallic in nature (i.e., the atomic bonds between the atoms are not substantially metallic bonds, but rather ionic and/or covalent in nature), but are rather dielectric materials, although they comprise metal atoms such as copper (in addition to non-metal elements such as silicon and/or nitrogen). Additional embodiments of the invention include methods similar to those described above in relation to FIGS. 1A-1G, but wherein the cap layer comprises a metal cap layer. Examples of such embodiments are described below with reference to FIGS. 2A-2F.

Figure 2A:
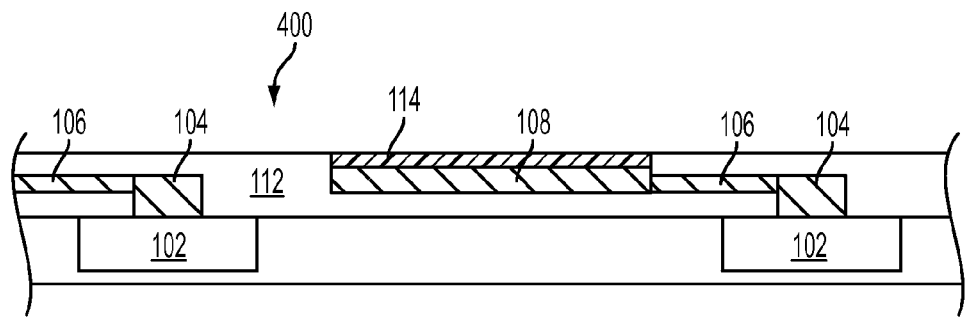
FIGS. 2A-2F are simplified cross-sectional views illustrating additional example embodiments of methods of forming bonded semiconductor structures of the invention.
Figure 2B:
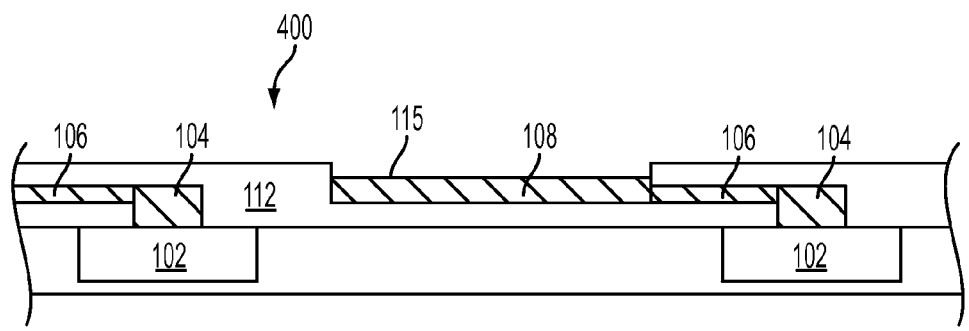

FIG. 2A illustrates a first semiconductor structure 400 that is substantially identical to the first semiconductor structure 100 of FIG. 1A, and includes active devices including transistors 102, vertically extending conductive vias 104, horizontally extending conductive traces 106, and bond pads 108. At least some of the active devices may be surrounded by dielectric material 112. The first semiconductor structure 400, upon formation thereof, may include an oxide material 114 at an exposed surface of the bond pads 108, as previously discussed in relation to the semiconductor structure 100 of FIG. 1A. For example, the bond pads 108 may comprise a metal or metal alloy (e.g., copper, copper alloy, CoSnP, Pd, etc.), and the oxide material 114 may comprise an oxide of that metal (e.g., copper oxide). As shown in FIG. 2B, the oxide material 114 may be removed from the bond pads 108 using, for example, a wet chemical etching process or a dry plasma etching process, as previously described with reference to FIG. 1B.

Figure 2C:
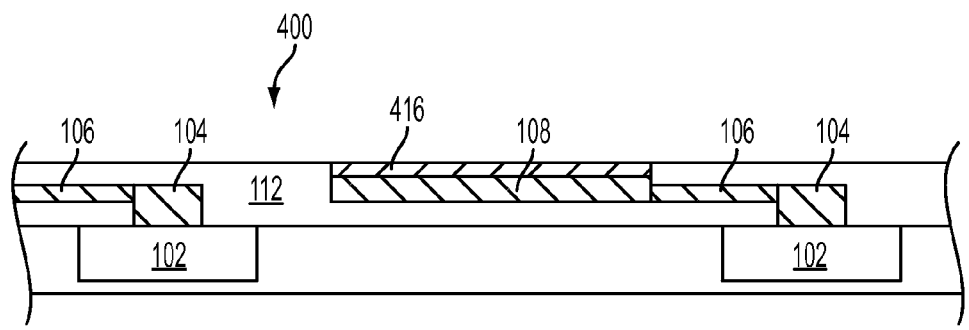

Referring to FIG. 2C, a metal cap layer 416 may be formed on and/or in the exposed surfaces 115 (FIG. 2B) of the bond pads 108 after removing the oxide material (FIG. 2A) from the surfaces of the bond pads 108. The metal cap layer 416 may have a composition differing from a composition of the bond pads 108, and may have a composition selected to hinder or prevent undesirable atomic diffusion and/or thermomechanical phenomena that might occur at the bonding interface formed during a subsequent bonding process. As a non-limiting example, the metal cap layer 416 may comprise a metal alloy that includes cobalt, tungsten, and phosphorous atoms (CoWP). A metal cap layer comprising CoWP may be formed using electroless plating processes with a dimethylaminoborane (DMAB) reducing agent, as known in the art. For further details, see, for example, Gambino et al., Yield and Reliability of Cu Capped with CoWP using a Self Activated Process, IEEE Interconnect Technology Conference, 2006 International, 5-7 Jun. 2006, pp. 30-32; and Yokogawa et al., Tradeoff Characteristics Between Resistivity and Reliability for Scaled-Down Cu-Based Interconnects, IEEE Transactions on Electron Devices, Vol. 55, No. 1, pp. 350-57 (January 2008), which are incorporated herein in their entireties by this reference.

In some embodiments, the metal cap layer 416 may have an average thickness of about forty nanometers (40 nm) or less, about twenty nanometers (20 nm) or less, or even about ten nanometers (10 nm) or less prior to the bonding process.

The metal cap layer 416 may be formed on and/or in the exposed surfaces 115 (FIG. 2B) using, for example, one or more of an electroless plating process, an electrolytic plating process, a physical deposition process, a physical vapor deposition (PVD) process, and a chemical vapor deposition process (CVD).

After forming the metal cap layer 416, the bond pads 108 may be directly bonded to metal features of a second semiconductor structure.

Figure 2D:
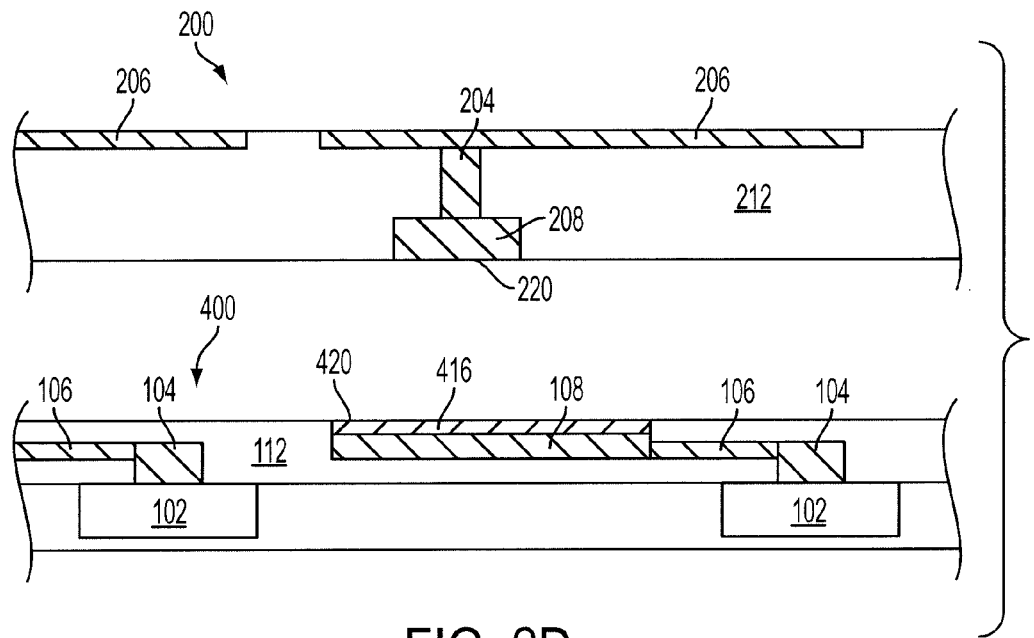

Referring to FIG. 2D, the first semiconductor structure 400 may be aligned with a second semiconductor structure 200. As previously described with reference to FIG. 1E, the second semiconductor structure 200 may include a plurality of active device features, which may include, for example, one or more of bond pads 208, vertically extending conductive vias 204, and horizontally extending conductive traces 206. The active device features of the second semiconductor structure 200 may be surrounded by dielectric material 212. The first semiconductor structure 400 may be aligned with the second semiconductor structure 200 such that the bond pads 108 of the first semiconductor structure 400 are aligned with the conductive metallic bond pads 208 of the second semiconductor structure 200.

Surfaces of the metal cap layer 416 on the bond pads 108 may define one or more bonding surfaces 420 of the bond pads 108, and exterior exposed surfaces of the bond pads 208 may define bonding surfaces 220 of the bond pads 208 of the second semiconductor structure 200.

Figure 2E:
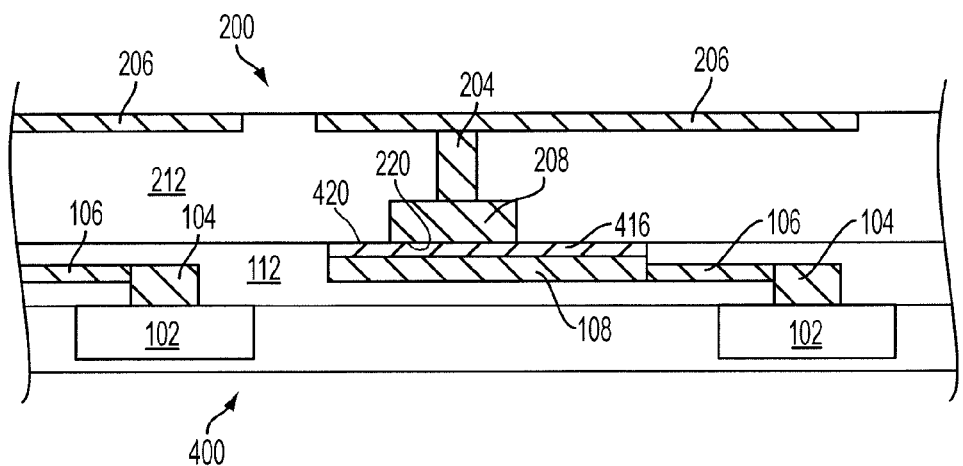

Referring to FIG. 2E, after aligning first semiconductor structure 400 and the second semiconductor structure 200 such that the bond pads 108 of the first semiconductor structure 400 are aligned with the conductive metallic bond pads 208 of the second semiconductor structure 200, the first semiconductor structure 400 may be abutted against the second semiconductor structure 200 such that the bonding surfaces 420 of the bond pads 108 of the first semiconductor structure 400 are abutted directly against the bonding surfaces 220 of the bond pads 208 of the second semiconductor structure 200.

Figure 2F:
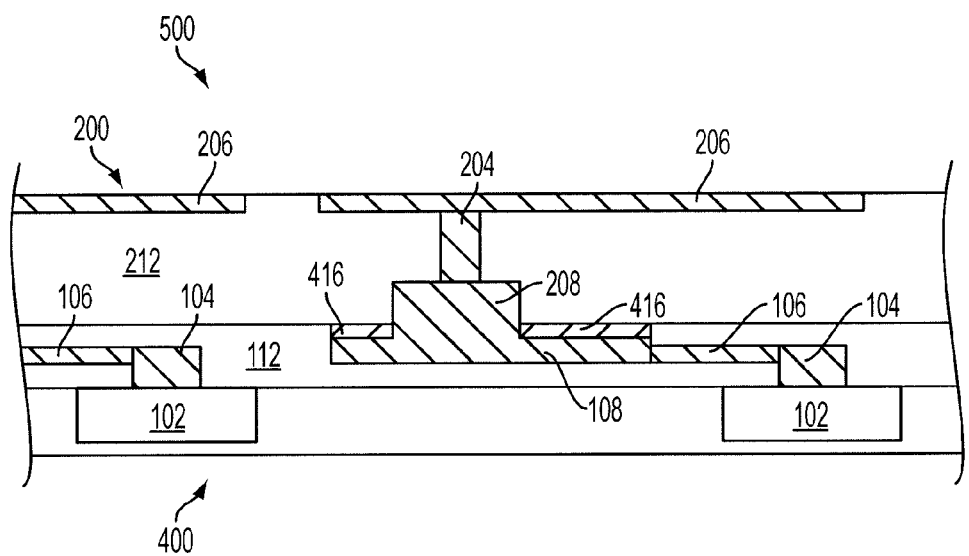

Referring to FIG. 2F, the bonding surfaces 420 of the bond pads 108 of the first semiconductor structure 400 then may be directly bonded to the bonding surfaces 220 of the bond pads 208 of the second semiconductor structure 200 to form a bonded semiconductor structure 500 shown in FIG. 2F. The bonding surfaces 220 of the bond pads 208 of the second semiconductor structure 200 may be directly bonded to the bonding surfaces 420 of the bond pads 108 of the first semiconductor structure 400 as previously described with reference to FIGS. 1F and 1G in relation to the first semiconductor structure 100 and the second semiconductor structure 200.

As shown in FIG. 2F, in some embodiments, upon directly bonding the bond pads 108 of the first semiconductor structure 400 to the bond pads 208 of the second semiconductor structure 200, one or more elements of the metal cap layer 416 at the interface between the bond pads 108 and the bond pads 208 may diffuse into the bond pads 108 and/or the bond pads 208, such that the metal cap layer 416 is no longer present as a distinct phase at the bonded interface between the bond pads 108 and the bond pads 208. At least a portion of the metal cap layer 416 may remain over at least a portion of the bond pads 108, as shown in FIG. 2F. The presence of at least a portion of the metal cap layer 416 over the bond pads 108 subsequent to the bonding process may be beneficial for reasons previously discussed herein with reference to FIG. 1G.

In the embodiments described above, metal and/or non-metal capping layers are used to improve characteristics of directly bonded metal features. In additional embodiments of the invention, the metal features may be selectively doped with one or more dopant elements to reduce electromigration, or otherwise improve performance and/or operational lifetime of the directly bonded metal features. Examples of such embodiments are described below with reference to FIGS. 3A-3G.

Figure 3A:
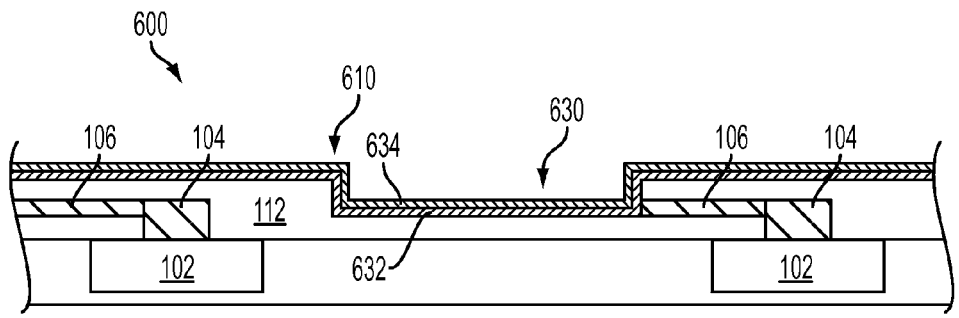
FIGS. 3A-3G are simplified cross-sectional views illustrating additional example embodiments of methods of forming bonded semiconductor structures of the invention.

FIG. 3A illustrates a first semiconductor structure 600 that is generally similar to the first semiconductor structure 100 of FIG. 1A in that the semiconductor structure 600 includes transistors 102, vertically extending conductive vias 104, and horizontally extending conductive traces 106. The first semiconductor structure 600 of FIG. 3A is shown prior to formation of doped bond pads 608 thereon, which are shown in FIG. 3C. In some embodiments, the bond pads 608 (FIG. 3C) may be doped during fabrication of the bond pads 608, as described with reference to FIGS. 3A-3C. In other embodiments, however, the bond pads 608 may be doped after formation of the bond pads 608.

As shown in FIG. 3A, recesses 630 may be formed in the first semiconductor structure 600 at locations at which it is desired to form bond pads 608 (FIG. 3C). For example, standard masking and etching processes may be used to form such recesses 630 in the first semiconductor structure 600. A liner material 632 may be provided over (e.g., on) at least the exposed surfaces of the semiconductor structure 600 within the recesses 630, although the liner material 632 may be conformally deposited over at least substantially the entire active surface 610 of the first semiconductor structure 600, as shown in FIG. 3A. The liner material 632 may comprise, for example, a barrier material having a composition selected to hinder or prevent diffusion of one or more atomic species through the liner material 632. By way of example and not limitation, the liner material 632 may comprise a material such as, for example, TaN or TiN. The liner material 632 may be provided on the semiconductor structure 600 using one or more of, for example, a chemical vapor deposition (CVD) process, a physical deposition process (e.g., sputtering), a physical vapor deposition (PVD) process, an atomic layer deposition (ALD) process, and an electroless plating process.

With continued reference to FIG. 3A, a doped metal seed material 634 may be deposited over the liner material 632. The doped metal seed material 634 may be used to facilitate the deposition of additional bulk metal material thereon, as discussed in further detail below with reference to FIG. 3B. By way of example and not limitation, the doped metal seed material 634 may be substantially comprised of a metal or metal alloy. As one non-limiting example, the doped metal seed material 634 may be substantially comprised of copper or a copper alloy. The doped metal seed material 634 may further include one or more dopant elements. As non-limiting examples, the dopant elements may comprise one or more of aluminum, silver, and manganese. The dopant elements may be introduced into the metal seed material 634 during deposition of the metal seed material 634 on the liner material 632, or the dopant elements may be introduced into the metal seed material 634 after forming the metal seed material 634 on the liner material 632. The doped metal seed material 634 may be provided on the semiconductor structure 600 using one or more of, for example, a chemical vapor deposition (CVD) process, a physical deposition process (e.g., sputtering), a physical vapor deposition (PVD) process, an atomic layer deposition (ALD) process, and an electroless plating process.

Figure 3B:
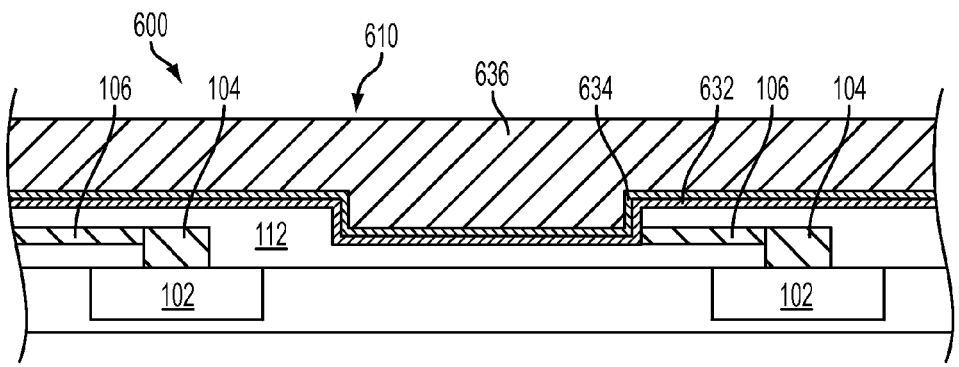
Figure 3C:
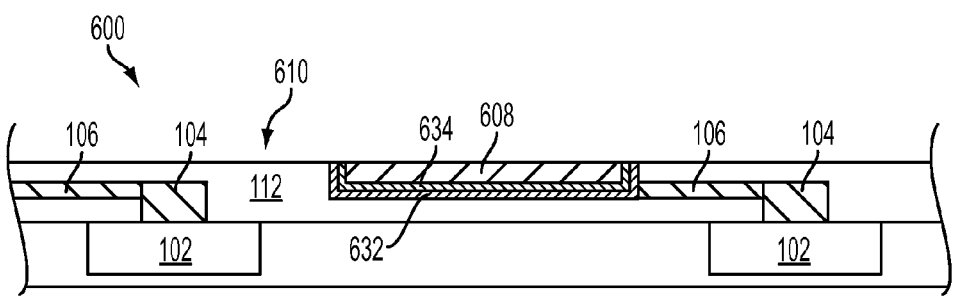

Referring to FIG. 3B, after forming the doped metal seed material 634 over the liner material 632, the metal seed material 634 may be used to facilitate deposition of bulk metal material 636 thereon in, for example, an electrolytic plating process. For example, the doped metal seed material 634 may be substantially comprised of doped copper or a doped copper alloy, and the bulk metal material 636 may comprise bulk copper metal, which may be deposited on the doped metal seed material 634 using an electrolytic plating process.

After depositing the bulk metal material 636 onto the doped metal seed material 634, the first semiconductor structure 600 may be subjected to an annealing process to cause the dopant elements (e.g., Al, Ag, Mn, etc.) to diffuse into the bulk metal material 636. The presence of the dopant elements in the bulk metal material 636 may be beneficial for reasons discussed in further detail below. The concentration of the dopant elements in the bulk metal material 636 may be selectively controlled by selectively controlling the thickness to which the doped metal seed material 634 is deposited over the liner material 632, as disclosed in Yokogawa et al., Analysis of Al Doping Effects on Resistivity and Electromigration of Copper Interconnects, IEEE Transactions on Device and Materials Reliability, Volume 8, Issue 1, pp. 216-21 (March 2008), which is incorporated herein in its entirety by this reference.

In additional embodiments of the invention, the bulk metal material 636 may be deposited on the liner material 632 using one or more processes other than an electrolytic process. For example, the bulk metal material 636 may be deposited using one or more of a chemical vapor deposition (CVD) process, a physical deposition process (e.g., sputtering), a physical vapor deposition (PVD) process, an atomic layer deposition (ALD) process, and an electroless plating process, and may be doped with the dopant elements as it is deposited.

In some embodiments, the bulk metal material 636 may be deposited to an average thickness that is sufficient to at least substantially fill the recesses 630 (FIG. 3A), and excess bulk metal material 636 may be present over the active surface 610 of the first semiconductor structure 600. Thus, referring to FIG. 3C, after depositing the bulk metal material 636, excess bulk metal material 636 may be removed using, for example, an etching process, a polishing process, or a chemical-mechanical polishing (CMP) process. As a non-limiting example, the active surface 610 of the first semiconductor structure 600 may be subjected to a chemical-mechanical polishing process to remove excess bulk metal material 636 from the active surface 610, but leaving bulk metal material 636 within the recesses (630) (FIG. 3A), thereby defining electrically conductive bond pads 608 in the active surface 610 that comprise the volumes of the doped bulk metal material 636 disposed within the recesses 630.

Figure 3D:
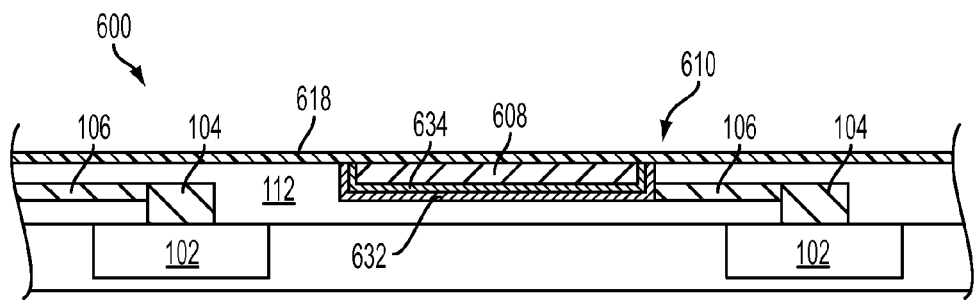

As shown in FIG. 3D, a cap layer 618 may be deposited at least over exposed surfaces of the bond pads 608, and may be deposited at least substantially entirely over the active surface 610 of the first semiconductor structure 600. By way of example and not limitation, the cap layer 618 may comprise a layer of a material, such as a carbide (e.g., silicon carbide), a nitride (e.g., silicon nitride), an oxide (e.g., silicon oxide), etc. In additional embodiments, the cap layer 618 may comprise a material as previously described herein in relation to the cap layer 116, the cap layer 118, or the metal cap layer 416, and may be formed as previously described in relation thereto. By way of example and not limitation, the cap layer 618 may be formed to have an initial average thickness of about forty nanometers (40 nm) or less, about twenty nanometers (20 nm)

or less, or even about ten nanometers (10 nm) or less (i.e., prior to bonding and/or other subsequent processing). The cap layer 618 may be formed using, for example, one or more of a physical vapor deposition (PVD) process, a chemical vapor deposition (CVD) process, an atomic layer deposition (ALD) process, etc. After forming the cap layer 618, the bond pads 608 may be directly bonded to metal features of a second semiconductor structure.

Figure 3E:
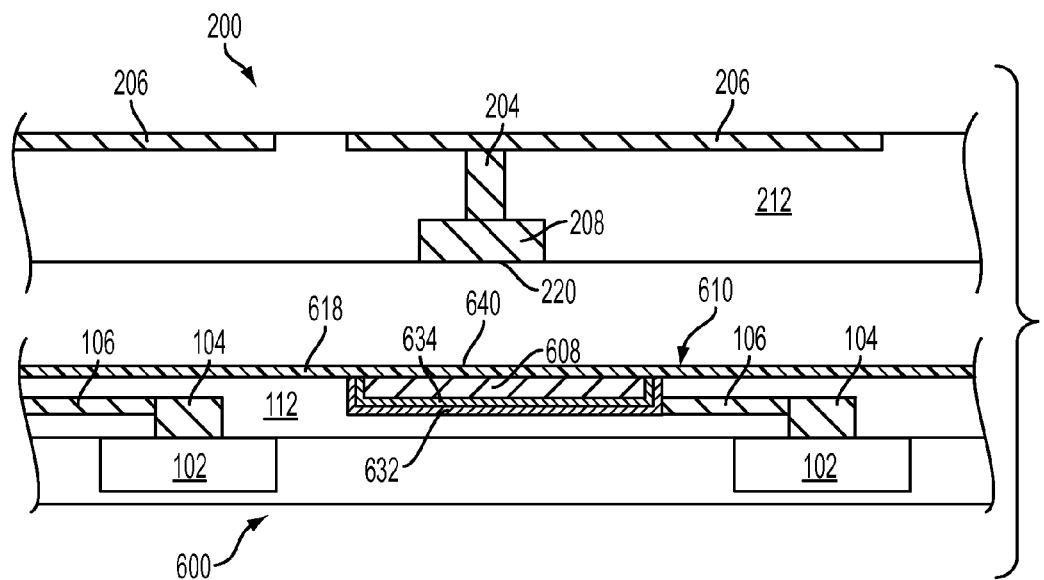

Referring to FIG. 3E, the first semiconductor structure 600 may be aligned with a second semiconductor structure 200. As previously described with reference to FIG. 1E, the second semiconductor structure 200 may include a plurality of active device features, which may include, for example, one or more of bond pads 208, vertically extending conductive vias 204, and horizontally extending conductive traces 206. The active device features of the second semiconductor structure 200 may be surrounded by dielectric material 212. The first semiconductor structure 600 may be aligned with the second semiconductor structure 200 such that the bond pads 608 of the first semiconductor structure 600 are aligned with the conductive metallic bond pads 208 of the second semiconductor structure 200.

Surfaces of the cap layer 618 on the bond pads 608 may define one or more bonding surfaces 640 of the bond pads 608, and exterior exposed surfaces of the bond pads 208 may define bonding surfaces 220 of the bond pads 208 of the second semiconductor structure 200.

Figure 3F:
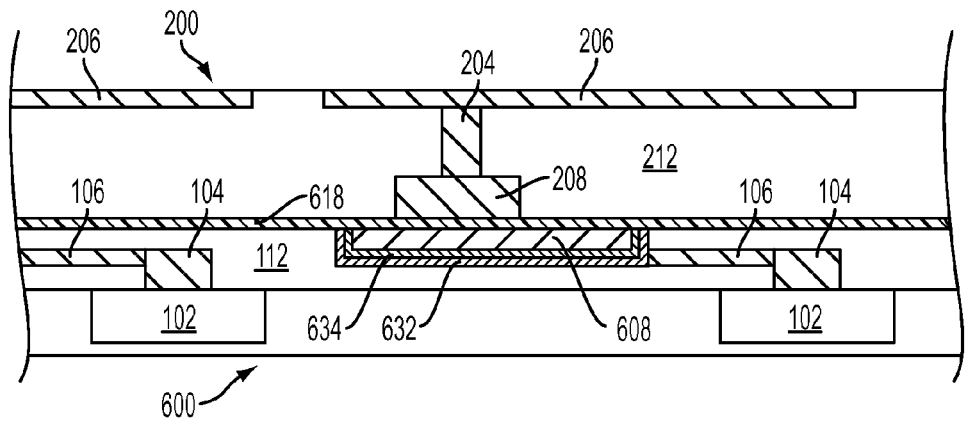

Referring to FIG. 3F, after aligning first semiconductor structure 600 and the second semiconductor structure 200 such that the bond pads 608 of the first semiconductor structure 600 are aligned with the conductive metallic bond pads 208 of the second semiconductor structure 200, the first semiconductor structure 600 may be abutted against the second semiconductor structure 200 such that the bonding surfaces 640 (FIG. 3E) of the bond pads 608 of the first semiconductor structure 600 are abutted directly against the bonding surfaces 220 (FIG. 3E) of the bond pads 208 of the second semiconductor structure 200.

Figure 3G:
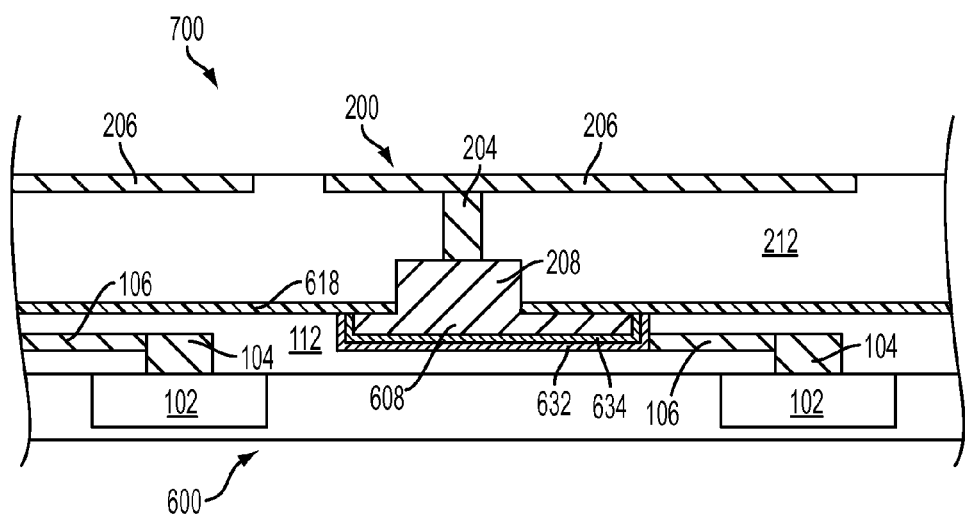

Referring to FIG. 3G, the bonding surfaces 640 (FIG. 3E) of the bond pads 608 of the first semiconductor structure 600 then may be directly bonded to the bonding surfaces 220 (FIG. 3E) of the bond pads 208 of the second semiconductor structure 200 to form a bonded semiconductor structure 700 shown in FIG. 3G. The bonding surfaces 220 (FIG. 3E) of the bond pads 208 of the second semiconductor structure 200 may be directly bonded to the bonding surfaces 640 (FIG. 3E) of the bond pads 608 of the first semiconductor structure 600 as previously described with reference to FIGS. 1F and 1G in relation to the first semiconductor structure 100 and the second semiconductor structure 200.

As shown in FIG. 3G, in some embodiments, upon directly bonding the bond pads 608 of the first semiconductor structure 600 to the bond pads 208 of the second semiconductor structure 200, one or more elements of the cap layer 618 at the interface between the bond pads 608 and the bond pads 208 may diffuse into the bond pads 608 and/or the bond pads 208, such that the cap layer 618 is no longer present as a distinct phase at the bonded interface between the bond pads 608 and the bond pads 208. At least a portion of the cap layer 618 may remain over at least a portion of the bond pads 608, as shown in FIG. 3G. The presence of at least a portion of the cap layer 618 over the bond pads 608 subsequent to the bonding process may be beneficial for reasons previously discussed herein with reference to FIG. 1G.

As previously mentioned, the presence of the dopant elements in the bond pads 608 may be beneficial in at least one aspect. For example, the dopant elements may segregate at grain boundaries and interfaces, including at the interface between the bond pads 608 and the cap layer 618. The segregated dopant elements may hinder diffusion of metal atoms (e.g., copper), and, hence, may improve the electromigration lifetime of the conductive structures defined by the adjoined bond pads 608 of the first semiconductor structure 600 and bond pads 208 of the second semiconductor structure 200.

The presence of such dopant elements in the bond pads 608 may increase the resistivity of the bond pads 608. Hence, the concentration of the dopants in the bond pads 608 may be selected such that the resistivity remains at an acceptable level, but such that the diffusion of metal atoms due to electromigration is reduced.

Although embodiments of the invention are described above with reference to processing of the bond pads of the first semiconductor structures by providing capping layers thereon and/or by doping the bond pads with selected dopant elements, it is contemplated that other metallic features of the first semiconductor structures, such as one or more conductive vias 104 and/or conductive traces 106 may be exposed at an active surface and may be processed as discussed above in relation to the bond pads 108, and may be directly bonded to metallic features of a second semiconductor structure in a manner similar to that described in relation to the bond pads. Additionally, it is contemplated that the conductive features of the second semiconductor structure, such as one or more of the bond pads 208, the conductive vias 204, and the conductive traces 206 may be processed as described herein in relation to the bond pads of the first semiconductor structures by providing capping layers thereon and/or by doping the bond pads with selected dopant elements, in addition to, or as an alternative to, processing of the conductive features of the first semiconductor structure, prior to directly bonding the one or more conductive features of the second semiconductor structure to one or more conductive features of a first semiconductor.

Additional non-limiting example embodiments of the invention are described below:

Embodiment 1

A method of directly bonding a first semiconductor structure to a second semiconductor structure, comprising: forming a cap layer comprising a metal and silicon at a surface of a first metal feature on the first semiconductor structure, a surface of the cap layer defining a first bonding surface of the first metal feature; and directly bonding a second bonding surface of a second metal feature on the second semiconductor structure to the first bonding surface of the first metal feature on the first semiconductor structure.

Embodiment 2

The method of Embodiment 1, further comprising forming the first metal feature to comprise copper.

Embodiment 3

The method of Embodiment 1 or Embodiment 2, wherein forming the cap layer comprising a metal and silicon comprises forming a copper compound comprising silicon at the surface of the first metal feature.

Embodiment 4

The method of any one of Embodiments 1 through 3, wherein forming the cap layer comprising a metal and silicon comprises forming a metal silicide.

Embodiment 5

The method of any one of Embodiments 1 through 3, wherein forming the cap layer comprising a metal and silicon comprises forming a cap layer comprising a metal and silicon and nitrogen.

Embodiment 6

The method of any one of Embodiments 1 through 5, further comprising: forming the first bonding surface to have a first size; and forming the second bonding surface to have a second size different from the first size of the first bonding surface.

Embodiment 7

The method of any one of Embodiments 1 through 6, further comprising: forming the first bonding surface to have a first shape; and forming the second bonding surface to have a second shape different from the first shape of the first bonding surface.

Embodiment 8

The method of any one of Embodiments 1 through 7, wherein directly bonding the second bonding surface to the first bonding surface comprises an ultra-low temperature direct bonding process.

Embodiment 9

The method of any one of Embodiments 1 through 8, wherein directly bonding the second bonding surface to the first bonding surface comprises a surface assisted bonding process.

Embodiment 10

The method of any one of Embodiments 1 through 9, wherein directly bonding the second bonding surface to the first bonding surface comprises abutting the first bonding surface directly against the second bonding surface in an environment at a temperature less than about four hundred degrees Celsius (400° C.).

Embodiment 11

The method of Embodiment 10, further comprising applying pressure between the first bonding surface and the second bonding surface in the environment at a temperature less than about two hundred degrees Celsius (200° C.).

Embodiment 12

The method of Embodiment 11, wherein applying pressure between the first bonding surface and the second bonding surface in the environment at a temperature less than about two hundred degrees Celsius (200° C.) comprises applying pressure between the first bonding surface and the second bonding surface in an environment at a temperature less than about one hundred degrees Celsius (100° C.).

Embodiment 13

The method of Embodiment 12, wherein applying pressure between the first bonding surface and the second bonding surface in the environment at a temperature less than about one hundred degrees Celsius (100° C.) comprises applying pressure between the first bonding surface and the second bonding surface in an environment at about room temperature.

Embodiment 14

The method of any one of Embodiments 1 through 13, further comprising doping the first metal feature on the first semiconductor structure with impurities prior to directly bonding the second bonding surface to the first bonding surface.

Embodiment 15

The method of any one of Embodiments 1 through 14, further comprising forming a cap layer comprising a metal and silicon at a surface of the second metal feature on the second semiconductor structure prior to directly bonding the second bonding surface to the first bonding surface, a surface of the cap layer at the surface of the second metal feature defining the second bonding surface of the second metal feature.

Embodiment 16

A method of directly bonding a first semiconductor structure to a second semiconductor structure, comprising: forming a metal cap layer at a surface of a first metal feature on the first semiconductor structure, a surface of the metal cap layer defining a first bonding surface of the first metal feature; and directly bonding a second bonding surface of a second metal feature on the second semiconductor structure to the first bonding surface of the first metal feature on the first semiconductor structure.

Embodiment 17

The method of Embodiment 16, further comprising forming the metal cap layer to comprise a metal alloy.

Embodiment 18

The method of Embodiment 16 or Embodiment 17, further comprising forming the first metal feature to comprise copper.

Embodiment 19

The method of any one of Embodiments 16 through 18, further comprising forming the metal cap layer to comprise CoWP.

Embodiment 20

The method of any one of Embodiments 16 through 19, further comprising forming the metal cap layer to have an average thickness of about ten nanometers (10 nm) or less.

Embodiment 21

The method of any one of Embodiments 16 through 20, further comprising: forming the first bonding surface to have a first size; and forming the second bonding surface to have a second size different from the first size of the first bonding surface.

Embodiment 22

The method of any one of Embodiments 16 through 21, further comprising: forming the first bonding surface to have a first shape; and forming the second bonding surface to have a second shape different from the first shape of the first bonding surface.

Embodiment 23

The method of any one of Embodiments 16 through 22, wherein directly bonding the second bonding surface to the first bonding surface comprises an ultra-low temperature direct bonding process.

Embodiment 24

The method of any one of Embodiments 16 through 23, wherein directly bonding the second bonding surface to the first bonding surface comprises a surface assisted bonding process.

Embodiment 25

The method of any one of Embodiments 16 through 24, wherein directly bonding the second bonding surface to the first bonding surface comprises abutting the first bonding surface directly against the second bonding surface in an environment at a temperature less than about two hundred degrees Celsius (200° C.).

Embodiment 26

The method of Embodiment 25, further comprising applying pressure between the first bonding surface and the second bonding surface in the environment at a temperature less than about two hundred degrees Celsius (200° C.).

Embodiment 27

The method of Embodiment 26, wherein applying pressure between the first bonding surface and the second bonding surface in the environment at a temperature less than about two hundred degrees Celsius (200° C.) comprises applying pressure between the first bonding surface and the second bonding surface in an environment at a temperature less than about one hundred degrees Celsius (100° C.).

Embodiment 28

The method of Embodiment 27, wherein applying pressure between the first bonding surface and the second bonding surface in the environment at a temperature less than about one hundred degrees Celsius (100° C.) comprises applying pressure between the first bonding surface and the second bonding surface in an environment at about room temperature.

Embodiment 29

The method of any one of Embodiments 16 through 28, further comprising doping the first metal feature on the first semiconductor structure with impurities prior to directly bonding the second bonding surface to the first bonding surface.

Embodiment 30

The method of any one of Embodiments 16 through 29, further comprising forming another metal cap layer at a surface of the second metal feature on the second semiconductor structure prior to directly bonding the second bonding surface to the first bonding surface, a surface of the another metal cap layer at the surface of the second metal feature defining the second bonding surface of the second metal feature.

Embodiment 31

A method of directly bonding a first semiconductor structure to a second semiconductor structure, comprising: doping a first metal feature on the first semiconductor structure with impurities; and directly bonding a second metal feature on the second semiconductor structure to the first metal feature on the first semiconductor structure.

Embodiment 32

The method of Embodiment 31, further comprising selecting the impurities to comprise at least one of aluminum, silver, and manganese.

Embodiment 33

The method of Embodiment 31 or Embodiment 32, wherein doping the first metal feature comprises: forming a metal seed layer including the impurities; and forming the first metal feature over the metal seed layer and diffusing the impurities from the metal seed layer into the first metal feature.

Embodiment 34

The method of any one of Embodiments 31 through 33, further comprising forming the first metal feature to comprise copper.

Embodiment 35

The method of any one of Embodiments 31 through 34, further comprising: forming the first bonding surface to have a first size; and forming the second bonding surface to have a second size different from the first size of the first bonding surface.

Embodiment 36

The method of any one of Embodiments 31 through 35, further comprising: forming the first bonding surface to have a first shape; and forming the second bonding surface to have a second shape different from the first shape of the first bonding surface.

Embodiment 37

The method of any one of Embodiments 31 through 36, wherein directly bonding the second bonding surface to the first bonding surface comprises an ultra-low temperature direct bonding process.

Embodiment 38

The method of any one of Embodiments 31 through 37, wherein directly bonding the second bonding surface to the first bonding surface comprises a surface assisted bonding process.

Embodiment 39

The method of any one of Embodiments 31 through 38, wherein directly bonding the second bonding surface to the first bonding surface comprises abutting the first bonding surface directly against the second bonding surface in an environment at a temperature less than about two hundred degrees Celsius (200° C.).

Embodiment 40

The method of Embodiment 39, further comprising applying pressure between the first bonding surface and the second bonding surface in the environment at a temperature less than about two hundred degrees Celsius (200° C.).

Embodiment 41

A bonded semiconductor structure, comprising: a first semiconductor structure comprising a first metal feature; and a second semiconductor structure comprising a second metal feature, the second metal feature of the second semiconductor structure directly bonded to the first metal feature of the first semiconductor structure; and impurities at a bonding interface between the first metal feature and the second metal feature.

Embodiment 42

The bonded semiconductor structure of Embodiment 41, wherein the impurities comprise at least one of aluminum, silver, and manganese.

Embodiment 43

The bonded semiconductor structure of Embodiment 41 or Embodiment 42, wherein the impurities comprises at least one of silicon and nitrogen.

Embodiment 44

The bonded semiconductor structure of any one of Embodiments 41 through 43, wherein the impurities comprise at least one of cobalt, tungsten, and phosphorous.

Embodiment 45

The bonded semiconductor structure of any one of Embodiments 41 through 44, wherein at least one of the first metal feature and the second metal feature comprises copper.

Embodiment 46

The bonded semiconductor structure of any one of Embodiments 41 through 45, wherein: the first metal feature has a first cross-sectional area in a plane parallel to a bonded interface between the first metal feature and the second metal feature; and the second metal feature has a second cross-sectional area in a plane parallel to the bonded interface between the first metal feature and the second metal feature, the second cross-sectional area differing from the first cross-sectional area.

Embodiment 47

The bonded semiconductor structure of any one of Embodiments 41 through 46, wherein: the first metal feature has a first cross-sectional shape in a plane parallel to a bonded interface between the first metal feature and the second metal feature; and the second metal feature has a second cross-sectional shape in a plane parallel to the bonded interface between the first metal feature and the second metal feature, the second cross-sectional shape differing from the first cross-sectional shape.

Embodiment 48

A bonded semiconductor structure, comprising: a first semiconductor structure comprising a first metal feature comprising a first major surface; a second semiconductor structure comprising a second metal feature at least partially surrounded by a dielectric material, the second metal feature of the second semiconductor structure having a second major surface directly bonded to a portion of the first major surface of the first metal feature of the first semiconductor structure; and a cap material disposed directly between a surface of the dielectric material and another portion of the first major surface of the first metal feature of the first semiconductor structure.

Embodiment 49

The bonded semiconductor structure of Embodiment 48, wherein the cap material comprises a dielectric material.

Embodiment 50

The bonded semiconductor structure of Embodiment 49, wherein the cap material comprises at least one of CuSiN, SiC, and SiN.

Embodiment 51

The bonded semiconductor structure of Embodiment 48, wherein the cap material comprises a conductive material.

Embodiment 52

The bonded semiconductor structure of Embodiment 51, wherein the cap material comprises CoWP.

Embodiment 53

The bonded semiconductor structure of any one of Embodiments 48 through 52, wherein at least one of the first metal feature and the second metal feature comprises copper.

Embodiment 54

The bonded semiconductor structure of any one of Embodiments 48 through 53, wherein: the first metal feature has a first cross-sectional area in a plane parallel to a bonded interface between the first metal feature and the second metal feature; and the second metal feature has a second cross-sectional area in a plane parallel to the bonded interface between the first metal feature and the second metal feature, the second cross-sectional area differing from the first cross-sectional area.

Embodiment 55

The bonded semiconductor structure of any one of Embodiments 48 through 54, wherein: the first metal feature has a first cross-sectional shape in a plane parallel to a bonded interface between the first metal feature and the second metal feature; and the second metal feature has a second cross-sectional shape in a plane parallel to the bonded interface between the first metal feature and the second metal feature, the second cross-sectional shape differing from the first cross-sectional shape.

The example embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternative useful combinations of the elements described, will become apparent to those skilled in the art from the description. In other words, one or more features of one example embodiment described herein may be combined with one or more features of another example embodiment described herein to provide additional embodiments of the invention. Such modifications and embodiments are also intended to fall within the scope of the appended claims.

What is claimed is:

1. A method of directly bonding a first semiconductor structure to a second semiconductor structure, comprising:
   forming a cap layer comprising a metal and silicon at a surface of a first metal feature on the first semiconductor structure, a surface of the cap layer defining a first bonding surface of the first metal feature; and
   directly bonding a second bonding surface of a second metal feature on the second semiconductor structure to the first bonding surface of the first metal feature on the first semiconductor structure.

2. The method of claim 1, further comprising forming the first metal feature to comprise copper.

3. The method of claim 2, wherein forming the cap layer comprising a metal and silicon comprises forming a copper compound comprising silicon at the surface of the first metal feature.

4. The method of claim 1, wherein forming the cap layer comprising a metal and silicon comprises forming a metal silicide.

5. The method of claim 1, wherein forming the cap layer comprising a metal and silicon comprises forming a cap layer comprising a metal and silicon and nitrogen.

6. The method of claim 1, further comprising:
   forming the first bonding surface to have a first size; and
   forming the second bonding surface to have a second size different from the first size of the first bonding surface.

7. The method of claim 1, further comprising:
   forming the first bonding surface to have a first shape; and
   forming the second bonding surface to have a second shape different from the first shape of the first bonding surface.

8. The method of claim 1, wherein directly bonding the second bonding surface to the first bonding surface comprises an ultra-low temperature direct bonding process.

9. The method of claim 1, wherein directly bonding the second bonding surface to the first bonding surface comprises a surface assisted bonding process.

10. The method of claim 1, wherein directly bonding the second bonding surface to the first bonding surface comprises abutting the first bonding surface directly against the second bonding surface in an environment at a temperature less than about two hundred degrees Celsius (200° C.).

11. The method of claim 10, further comprising applying pressure between the first bonding surface and the second bonding surface in the environment at a temperature less than about two hundred degrees Celsius (200° C.).

12. The method of claim 11, wherein applying pressure between the first bonding surface and the second bonding surface in the environment at a temperature less than about two hundred degrees Celsius (200° C.) comprises applying pressure between the first bonding surface and the second bonding surface in an environment at a temperature less than about one hundred degrees Celsius (100° C.).

13. The method of claim 12, wherein applying pressure between the first bonding surface and the second bonding surface in the environment at a temperature less than about one hundred degrees Celsius (100° C.) comprises applying pressure between the first bonding surface and the second bonding surface in an environment at about room temperature.

14. The method of claim 1, further comprising doping the first metal feature on the first semiconductor structure with impurities prior to directly bonding the second bonding surface to the first bonding surface.

15. The method of claim 1, further comprising forming a cap layer comprising a metal and silicon at a surface of the second metal feature on the second semiconductor structure prior to directly bonding the second bonding surface to the first bonding surface, a surface of the cap layer at the surface of the second metal feature defining the second bonding surface of the second metal feature.

16. A method of directly bonding a first semiconductor structure to a second semiconductor structure, comprising:
   doping a first metal feature on the first semiconductor structure with impurities; and
   directly bonding a second metal feature on the second semiconductor structure to the first metal feature on the first semiconductor structure.

17. The method of claim 16, further comprising selecting the impurities to comprise at least one of aluminum, silver, and manganese.

18. The method of claim 16, wherein doping the first metal feature comprises:
forming a metal seed layer including the impurities; and
forming the first metal feature over the metal seed layer and diffusing the impurities from the metal seed layer into the first metal feature.

19. The method of claim 16, further comprising forming the first metal feature to comprise copper.

20. The method of claim 16, further comprising:
forming the first bonding surface to have a first size; and
forming the second bonding surface to have a second size different from the first size of the first bonding surface.

21. The method of claim 16, further comprising:
forming the first bonding surface to have a first shape; and
forming the second bonding surface to have a second shape different from the first shape of the first bonding surface.

22. The method of claim 16, wherein directly bonding the second bonding surface to the first bonding surface comprises an ultra-low temperature direct bonding process.

23. The method of claim 16, wherein directly bonding the second bonding surface to the first bonding surface comprises a surface assisted bonding process.

24. The method of claim 16, wherein directly bonding the second bonding surface to the first bonding surface comprises abutting the first bonding surface directly against the second bonding surface in an environment at a temperature less than about two hundred degrees Celsius (200° C.).

25. The method of claim 24, further comprising applying pressure between the first bonding surface and the second bonding surface in the environment at a temperature less than about two hundred degrees Celsius (200° C.).

26. A bonded semiconductor structure, comprising:
a first semiconductor structure comprising a first metal feature; and
a second semiconductor structure comprising a second metal feature, the second metal feature of the second semiconductor structure directly bonded to the first metal feature of the first semiconductor structure; and
impurities at a bonding interface between the first metal feature and the second metal feature.

27. The bonded semiconductor structure of claim 26, wherein the impurities comprise at least one of aluminum, silver, and manganese.

28. The bonded semiconductor structure of claim 26, wherein the impurities comprise at least one of silicon and nitrogen.

29. The bonded semiconductor structure of claim 26, wherein the impurities comprise at least one of cobalt, tungsten, and phosphorous.

30. The bonded semiconductor structure of claim 26, wherein at least one of the first metal feature and the second metal feature comprises copper.

31. The bonded semiconductor structure of claim 26, wherein:
the first metal feature has a first cross-sectional area in a plane parallel to a bonded interface between the first metal feature and the second metal feature; and
the second metal feature has a second cross-sectional area in a plane parallel to the bonded interface between the first metal feature and the second metal feature, the second cross-sectional area differing from the first cross-sectional area.

32. The bonded semiconductor structure of claim 26, wherein:
the first metal feature has a first cross-sectional shape in a plane parallel to a bonded interface between the first metal feature and the second metal feature; and
the second metal feature has a second cross-sectional shape in a plane parallel to the bonded interface between the first metal feature and the second metal feature, the second cross-sectional shape differing from the first cross-sectional shape.

33. A bonded semiconductor structure, comprising:
a first semiconductor structure comprising a first metal feature comprising a first major surface;
a second semiconductor structure comprising a second metal feature at least partially surrounded by a dielectric material, the second metal feature of the second semiconductor structure having a second major surface directly bonded to a portion of the first major surface of the first metal feature of the first semiconductor structure; and
a cap material disposed directly between a surface of the dielectric material and another portion of the first major surface of the first metal feature of the first semiconductor structure, the cap material not present at a bonded interface between the second major surface of the second metal feature and the portion of the first major surface of the first metal feature, and the cap material having a composition differing from a composition of the first metal feature.

34. The bonded semiconductor structure of claim 33, wherein the cap material comprises a dielectric material.

35. The bonded semiconductor structure of claim 34, wherein the cap material comprises at least one of CuSiN, SiC, and SiN.

36. The bonded semiconductor structure of claim 33, wherein the cap material comprises a conductive material.

37. The bonded semiconductor structure of claim 36, wherein the cap material comprises CoWP.

38. The bonded semiconductor structure of claim 33, wherein at least one of the first metal feature and the second metal feature comprises copper.

39. The bonded semiconductor structure of claim 33, wherein:
the first metal feature has a first cross-sectional area in a plane parallel to a bonded interface between the first metal feature and the second metal feature; and
the second metal feature has a second cross-sectional area in a plane parallel to the bonded interface between the first metal feature and the second metal feature, the second cross-sectional area differing from the first cross-sectional area.

40. The bonded semiconductor structure of claim 33, wherein:
the first metal feature has a first cross-sectional shape in a plane parallel to a bonded interface between the first metal feature and the second metal feature; and
the second metal feature has a second cross-sectional shape in a plane parallel to the bonded interface between the first metal feature and the second metal feature, the second cross-sectional shape differing from the first cross-sectional shape.

41. A method of directly bonding a first semiconductor structure to a second semiconductor structure, comprising:
doping a first metal feature on the first semiconductor structure with impurities;
forming a metal cap layer at a surface of the first metal feature on the first semiconductor structure, a surface of the metal cap layer defining a first bonding surface of the first metal feature, the first metal feature configured to carry electrical current during use of the first semiconductor structure, the metal cap layer having a composition hindering electromigration of atoms of the first metal feature during use of the first semiconductor structure; and directly bonding a second bonding surface of a second metal feature on the second semiconductor structure to the first bonding surface of the first metal feature on the first semiconductor structure.

42. A method of directly bonding a first semiconductor structure to a second semiconductor structure, comprising:

forming a metal cap layer at a surface of a first metal feature on the first semiconductor structure, a surface of the metal cap layer defining a first bonding surface of the first metal feature, the first metal feature configured to carry electrical current during use of the first semiconductor structure, the metal cap layer having a composition hindering electromigration of atoms of the first metal feature during use of the first semiconductor structure;

forming another metal cap layer at a surface of a second metal feature on the second semiconductor structure, a surface of the another metal cap layer at the surface of the second metal feature defining a second bonding surface of the second metal feature; and directly bonding the second bonding surface of the second metal feature on the second semiconductor structure to the first bonding surface of the first metal feature on the first semiconductor structure.

* * * * *

UNITED STATES PATENT AND TRADEMARK OFFICE
CERTIFICATE OF CORRECTION

| | | |
|---|---|---|
| PATENT NO. | : 8,778,773 B2 | Page 1 of 1 |
| APPLICATION NO. | : 12/970422 | |
| DATED | : July 15, 2014 | |
| INVENTOR(S) | : Mariam Sadaka | |

It is certified that error appears in the above-identified patent and that said Letters Patent is hereby corrected as shown below:

In the specification:

COLUMN 12, LINE 50, change "recesses (630)" to --recesses 630--

In the claims:

| | | | |
|---|---|---|---|
| CLAIM 20, | COLUMN 21, | LINE 13, | change "the first bonding surface to" to --a first bonding surface of the first metal feature to-- |
| CLAIM 20, | COLUMN 21, | LINE 14, | change "the second bonding surface to" to --a second bonding surface of the second metal feature to-- |
| CLAIM 21, | COLUMN 21, | LINE 17, | change "the first bonding surface to" to --a first bonding surface of the first metal feature to-- |
| CLAIM 21, | COLUMN 21, | LINE 18, | change "the second bonding surface to" to --a second bonding surface of the second metal feature to-- |
| CLAIM 22, | COLUMN 21, | LINE 21, | change "second bonding surface to the first bonding surface" to --second metal feature to the first metal feature-- |
| CLAIM 23, | COLUMN 21, | LINE 25, | change "second bonding surface to the first bonding surface" to --second metal feature to the first metal feature-- |
| CLAIM 24, | COLUMN 21, | LINE 28, | change "second bonding surface to the first bonding surface" to --second metal feature to the first metal feature-- |
| CLAIM 24, | COLUMN 21, | LINE 29, | change "the first bonding surface directly" to --a first bonding surface of the first metal feature directly-- |
| CLAIM 24, | COLUMN 21, | LINES 29-30, | change "against the second bonding surface in" to --against a second bonding surface of the second metal feature in-- |
| CLAIM 25, | COLUMN 21, | LINE 33, | change "the first bonding surface" to --the first metal feature-- |
| CLAIM 25, | COLUMN 21, | LINES 33-34, | change "the second bonding surface" to --the second metal feature-- |

Signed and Sealed this
Third Day of May, 2016

Michelle K. Lee
*Director of the United States Patent and Trademark Office*